United States Patent
Molarius et al.

(10) Patent No.: US 6,521,100 B2
(45) Date of Patent: Feb. 18, 2003

(54) METHOD OF PRODUCING A PIEZOELECTRIC THIN FILM AND BULK ACOUSTIC WAVE RESONATOR FABRICATED ACCORDING TO THE METHOD

(75) Inventors: Jyrki Molarius, Espoo (FI); Markku Ylilammi, Espoo (FI)

(73) Assignee: Nokia Mobile Phones Ltd, Espoo (FI)

( * ) Notice: Subject to any disclaimer, the term of this patent is extended or adjusted under 35 U.S.C. 154(b) by 31 days.

(21) Appl. No.: 09/776,170

(22) Filed: Feb. 2, 2001

(65) Prior Publication Data

US 2002/0134669 A1 Sep. 26, 2002

(51) Int. Cl.$^7$ ............... C23C 14/35; H04R 17/00
(52) U.S. Cl. ............... 204/192.18; 204/192.13; 29/25.35
(58) Field of Search ............... 204/192.12, 192.13, 204/192.18; 428/411.1; 438/14; 29/25.35; 310/311, 313 R

(56) References Cited

U.S. PATENT DOCUMENTS

| | | | |
|---|---|---|---|
| 5,714,917 A | | 2/1998 | Ella ............... 332/144 |
| 5,873,154 A | | 2/1999 | Ylilammi et al. ............... 29/25.35 |
| 5,910,756 A | | 6/1999 | Ella ............... 333/133 |
| 5,944,964 A | * | 8/1999 | Solberg et al. ............... 204/192.26 |
| 6,060,818 A | | 5/2000 | Ruby et al. ............... 310/363 |
| 6,139,699 A | * | 10/2000 | Chiang et al. ............... 204/192.15 |
| 6,312,568 B2 | * | 11/2001 | Wilke et al. ............... 204/192.18 |
| 2002/0008443 A1 | * | 1/2002 | Yamada et al. ............... 310/324 |

OTHER PUBLICATIONS

English abstract of JP 2–38566.*
"Development of Miniature Filters for Wireless Applications", IEEE Transactions on Microwave Theory and Techniques, vol. 43, No. 12, Dec. 1995.
IEEE MTT–S 1997; pp 181–184; Thin FilmZnO Based Bulk Acoustic Mode Filters, C.W. Seabury, et al.

"Acoustic Bulk Wave Composite Resonators," by K.M. Lakin and J.S. Wang, from *Applied Physics Letter*, Feb. 1, 1981, vol. 38, No. 3, pp. 125–127.

"Face–Mounted Piezoelectric Resonators," by W.E. Newell, from *Proceedings of the IEEE*, Jun. 1965, pp. 575–581.

"FBAR Technology Shrinks CDMA Handset Duplexers," by D. McNamara, from *Microwaves & RF*, Sep. 2000, pp. 71–79.

* cited by examiner

Primary Examiner—Steven H. VerSteeg
(74) Attorney, Agent, or Firm—Ware, Fressola, Van Der Sluys & Adolphson LLP

(57) ABSTRACT

A method of use in fabricating a device comprising a thin film of material, the fabrication using magnetron sputtering to deposit the thin film on a surface of some other material, the method including the step of: performing successive sputtering cycles, each cycle including sputtering at a first gas pressure so as to achieve a predetermined first thickness, and sputtering at a second, different gas pressure, so as to obtain a predetermined second thickness. The thin film so deposited has an average stress intermediate between the first stress and the second stress, an average stress that can be made to be approximately equal to a predetermined intermediate stress by a judicious choice of the time for sputtering at each of the two pressures. Usually, the thin film is built up incrementally, using many successive cycles of sputtering at first the first gas pressure and then the second gas pressure.

3 Claims, 4 Drawing Sheets

METHOD OF PRODUCING A PIEZOELECTRIC THIN FILM AND BULK ACOUSTIC WAVE RESONATOR FABRICATED ACCORDING TO THE METHOD

FIELD OF THE INVENTION

The present invention relates to bulk acoustic wave resonators, such as are used in providing bulk acoustic wave filters, and also to other devices built up from layers of thin film. More particularly, the present invention relates to providing a piezoelectric thin film, or a thin film of some other material, as a layer of such a resonator or as a layer of some other, similar device.

BACKGROUND OF THE INVENTION

A thin film bulk acoustical wave (BAW) resonator is a structure consisting of various layers of different materials deposited one on top of the other, starting with a first layer deposited on a substrate which is typically silicon (Si), glass, gallium arsenide (GaAs), or silicon dioxide (SiO2). As shown in FIG. 1, one of the layers of a BAW resonator is a layer of piezoelectric material, also called a piezolayer, which gives the BAW resonator its characteristic resonance properties, making it useful as a component of a filter. The piezolayer is deposited on top of a layer of metallic material serving as one electrode, and then a second layer of metallic material is deposited on the piezolayer. Typical materials used for the piezolayer include zinc oxide (ZnO) and aluminum nitride (AlN).

The prior art teaches using magnetron sputtering to deposit a piezolayer on a layer of material (typically a layer of metallic material serving as an electrode), i.e. a substrate. The magnetron creates a plasma by accelerating electrons in a low pressure gas (of typically argon). A bias voltage is applied to the target (i.e. the sample of the material to be deposited, such as ZnO) so as to cause the surface exposed to the plasma to be at a negative potential, which causes the target surface to be bombarded by positive ions of the (low pressure) plasma (i.e. usually argon ions). The positive ions have very high energy and so vaporize atoms on the target surface. The vaporized atoms fly to the substrate and so form the thin film layer on the substrate.

The maximum bandwidth of a filter based on thin film resonators (FBAR) is determined by the effective piezoelectric coupling $k_{eff}$ of the resonators. This is ultimately limited by the properties of the piezoelectric layer. The values for piezoelectric coefficient e of the materials typically used for a piezolayer, such as AlN and ZnO, are sufficiently high when the materials are in the form of bulk, single crystalline specimens, but in thin-film form the values attained are usually far below the bulk values because of the unfavorable microstructure of the thin film as produced by the present thin film deposition processes.

The important factors in determining the piezoelectricity of a thin film are crystallographic characteristics including crystallinity, crystal orientation, and grain size, but practice has shown that their significance is secondary compared to the state of stress of the thin film when deposited. Besides the crystallographic characteristics, a good piezoelectric thin-film material invariably exhibits a compressive stress. It appears from practice that having a compressive stress within some suitable range is the only indisputable criterion for an excellent piezofilm.

The primary parameters in adjusting the film stress in sputter deposition are the pressure of the sputtering atmosphere and the bias voltage applied to the substrate. Lowering the pressure or increasing the bias voltage shifts the stress in the compressive direction. Both of these factors increase the particle bombardment of the growing film. When a piezolayer is being deposited on an electrode layer that ultimately rests on a dielectric (glass) substrate, the capacitive bias voltage is ill-defined and its control imprecise, and the gas pressure remains the only practical control parameter. By altering the gas pressure, the piezolayer can be grown in either tensional or compressive stress. However, too high a stress (either compressional or tensional) will break the film or cause micro-cracks, and a film even with micro-cracks is not suitable piezoelectrically. A high enough stress will even delaminate a piezolayer from the bottom electrode. Therefore, a precise control of the stress state is essential, and such control is achieved principally through control of the gas pressure.

While it is quite straightforward to grow a ZnO film either in tension or in a high compressive stress state using magnetron sputtering, it has turned out to be difficult to achieve moderate values of compressive stress of the piezolayer, and it is moderate values of compressive stress that are needed for an acceptable piezolayer. Moderate values of compressive stress are difficult to achieve because magnetron sputter deposition at intermediate gas pressures is unstable. The reason for the instability is apparently due to the behavior of the plasma. Other parameters, besides the gas pressure, that determine the characteristics of the plasma are the gas composition, drive voltage, and history of the glow, the glow history being a factor because the plasma is non-linear (in its current-voltage characteristics) and may attain several steady-state glow modes that persist until something induces the plasma to switch to another mode. Perhaps because of the non-linear properties of the plasma, in practice, a deposition process using a gas pressure that would at least sometimes yield a compressive stress in a desirable range does not always do so; the process is not reliable, i.e. the results are not reproducible. Many of the resulting layers have a stress outside of the acceptable range, while others are nicely within the acceptable range. The yield of the process, i.e. the number of acceptable layers compared to the total number of layers produced, is, however, low enough to be a significant contributor to the cost of fabrication.

What is needed therefore, is a process of depositing piezoelectric material on a surface that consistently provides that the piezolayer has an appropriately moderate value of compressive stress, a value that will provide advantageous piezoelectric qualities.

SUMMARY OF THE INVENTION

Accordingly, the present invention provides a method and a device made according to the method, the method being of use in fabricating a device comprising a thin film of material, the fabrication using magnetron sputtering to deposit the thin film, the method comprising the steps of: a) determining a first gas pressure at which the magnetron sputtering is stable and results in the material being deposited having a first stress; b) determining a second gas pressure at which the sputtering is stable and results in the material being deposited having a second stress, the second stress having a value that is less than a desired intermediate stress; and c) performing successive sputtering cycles, each cycle including sputtering at the first gas pressure so as to achieve a predetermined first thickness, and sputtering at the second gas pressure so as to obtain a predetermined second thickness; thereby depositing a thin film of the material having an average stress intermediate between the first stress and the second stress.

In a further aspect of the invention, the material being laid down is a piezoelectric material.

In another, further aspect of the invention, the device is a bulk acoustic wave resonator.

In the usual application, the thin film is built up incrementally, using many successive cycles of sputtering at first the first gas pressure and then the second gas pressure.

BRIEF DESCRIPTION OF THE DRAWINGS

The above and other objects, features and advantages of the invention will become apparent from a consideration of the subsequent detailed description presented in connection with accompanying drawings, in which.

BEST MODE FOR CARRYING OUT THE INVENTION

The invention provides a method for depositing piezoelectric material as part of the process of fabricating, for example, a bulk acoustic wave (BAW) resonator. The invention can also be used in any situation in which it is desirable to deposit a material as a thin film so as to have a predetermined stress, when holding control parameters that would provide the predetermined stress at static values results in an unstable process. For clarity, though, the invention will be described in the context of depositing piezoelectric material as a thin film using magnetron sputtering as part of the fabrication of a BAW resonator.

As indicated above, to provide a piezolayer with advantageous piezoelectric qualities, it is necessary to deposit the piezo-material so as to have a compressive stress in a predetermined range. The principle factor in determining the stress of a piezolayer so deposited is the gas pressure. The gas pressures corresponding to the desired stress range, however, provide stresses that fall within the desired range only a fraction of the time, possibly due to non-linearities in the behavior of the plasma into which the piezo-material is converted for deposition by sputtering with a magnetron. The invention achieves a compressive stress in the desired range while avoiding the non-linear behavior of the plasma by cyclically changing the sputtering pressure so that the resulting stress attains the desired value. Because both a high stress and a low or negative stress in a piezoelectric material such as ZnO can be achieved reliably, whereas a moderate compressive stress cannot, a deposition process according to the invention uses a high gas pressure and a low gas pressure alternately in rapid succession to create an average stress state that is in the desired (moderately compressive) range.

Figure 1:
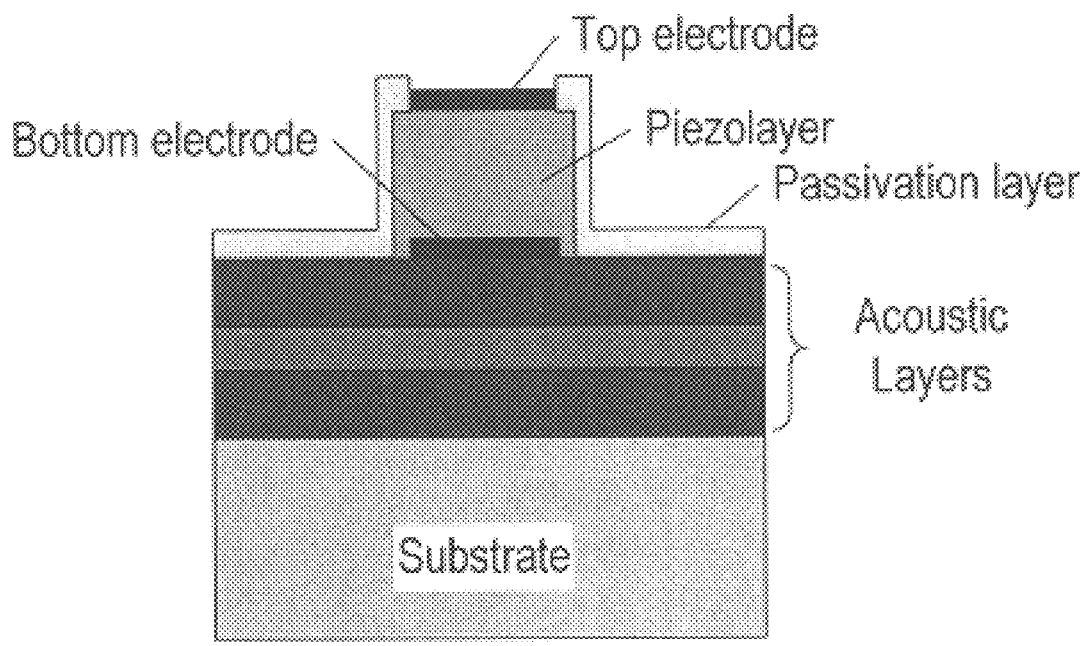
FIG. 1 is one example of a bulk acoustic wave (BAW) resonator, according to the prior art, showing a piezolayer deposited as a thin film between two electrodes.
Figure 2:
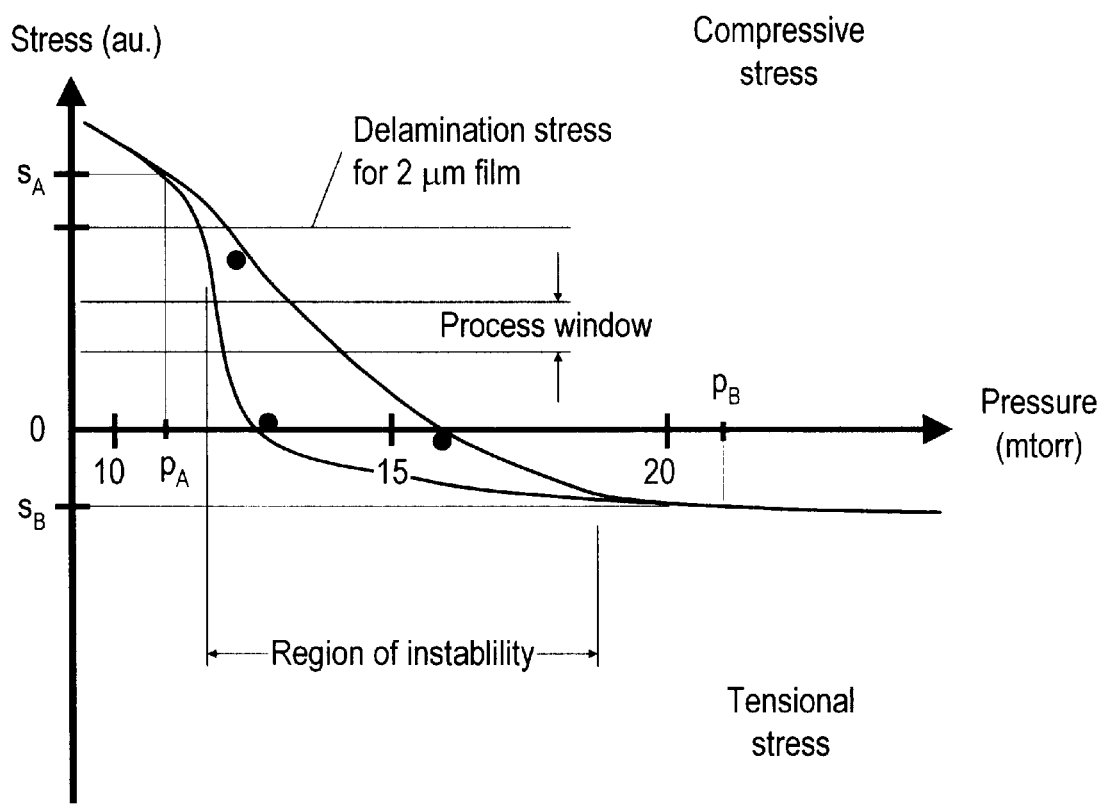
FIG. 2 is a graph illustrating the idea according to the invention of achieving a desirable compressive stress in depositing a piezoelectric material.

Referring now to FIG. 2, which is a schematic representation of the mechanical stress of a piezolayer (i.e. after being deposited) as a function of pressure in the sputtering chamber, it is seen that there is a region of instability associated with a range of gas pressures in which the stress resulting from the use of a gas pressure in the associate range may lie anywhere between two different curves, depending on the characteristics of the plasma. The data points denote measured samples (wafer codes 2W180, 2W185, 2W188.2). These have a double $W/SiO_2$ quarter wavelength acoustic mirror on a glass substrate covered by a gold bottom electrode. The curves of FIG. 2 show the general extreme cases of the stress/pressure relationship. Unfortunately, the best piezolayers have a compressive stress that corresponds to a gas pressure in the region of instability. The range of desirable compressive stress is indicated as the process window. The invention uses gas pressures on either side of the region of instability, alternately, so as to achieve a piezolayer with an average compressive stress within the process window.

Figure 3:
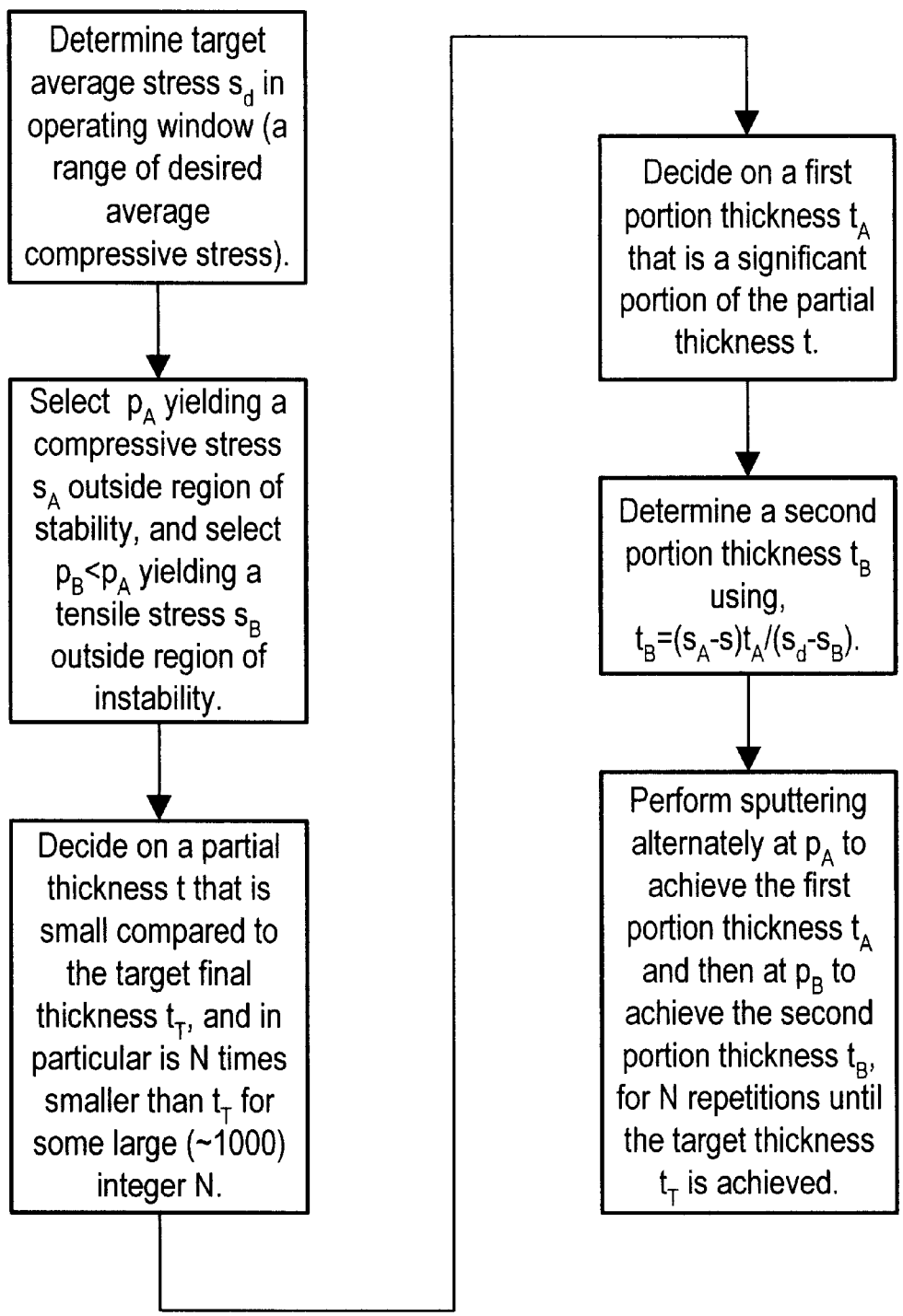
FIG. 3 is a flowchart illustrating the method of the invention of depositing a piezoelectric material as a thin film having a predetermined compressive stress.

Referring now also to FIG. 3, according to the invention, a gas pressure $p_A$ is used to grow a thickness $t_A$ of a piezolayer material (such as ZnO) in stress $s_A$, and a gas pressure $p_B$ is used for thickness $t_B$ in stress $s_B$. The cycle thickness $t_A+t_B$ is chosen to be small enough (say 20 nm) that the resulting stress s is close to the average value given by, $$s = \frac{t_A s_A + t_B s_B}{t_A + t_B}. \quad (1)$$

The deposition first at $p_A$ and then at $p_B$ is repeated until a final target thickness $t_T$ is achieved, the sputtering alternately rapidly between $p_A$ and $p_B$ and back to $p_A$ and so on.

Thus, two different gas pressures $p_A$ and $p_B$ are selected to produce two different stresses, a compressive stress $s_A$ outside of the region of instability and a tensile or weakly compressive stress $s_B$ also outside of the region of instability (but on the other side of the region of instability than the compressive stress $s_A$). Sputtering is then performed alternately at the gas pressure $p_A$ and then at the gas pressure $p_B$, alternating rapidly between the two in a series of sputtering cycles. Each cycle is performed for a period of time determined to produce a partial thickness t of the piezo-material, of which a portion $t_A$ is at stress $s_A$ and a portion $t_B$ is at stress $s_B$, i.e. $t=t_A+t_B$. The (total) target thickness $t_T$ results only after many sputtering cycles performed in rapid succession, and the number N of such repetitions is determined. In practice, an appropriate partial thickness t is assumed (so that N is typically between 50 and 1000) and one portion thickness, say $t_A$ (with $t_A<t$), is assumed; then, knowing the pressures $p_A$ and $p_B$ and so the corresponding to stresses $s_A$ and $s_B$, the other portion thickness (in our case $t_B$) is determined using equation (1), i.e. so that the average stress at the completion of each sputtering cycle is the desired intermediate compressive stress s.

For example, referring again to FIG. 2, suppose the desired intermediate compressive stress is s=60 MPa. Then one might select as a first gas pressure, the value $p_A$ that yields a first, compressive stress $s_A$=180 MPa, which is outside of the region of instability, and one might further select as a second gas pressure the value $p_B$ that yields a second, tensile stress $s_B$=−50 MPa, which is also outside of the region of instability (and on the opposite side of the region as the compressive stress). Then by deciding on a portion thickness $t_A$ of 8 nm to be the thickness deposited in one sputtering cycle at the first gas pressure, $p_A$, and so to end up having a compressive stress $s_A$, the required thickness to be grown under pressure $p_B$ during one sputtering cycle is determined from equation (1) to be, $$t_B = \frac{s_A - s}{s - s_B} t_A = \frac{180 - 60}{60 - (-50)} 8 \text{ nm} = 8.7 \text{ nm}. \quad (2)$$

The value selected for $t_A$ should be a small fraction, perhaps 0.1%, of the target thickness, so that the sputtering alternates rapidly, many times, between the two pressures $p_A$ and $p_B$.

It is clear from the above description that many minor variations of the method of the invention are possible without departing from the spirit and scope of the invention. For example, instead of deciding on a partial thickness $t=t_A+t_B$, and deciding on a partial portion $t_A$, and so on, it is possible to proceed more systematically as follows. First, given the (total) target thickness $t_T$ and given the desired intermediate compressive stress s, deciding on a number N of sputtering cycles in which to achieve the target thickness $t_T$ so that each sputtering cycle provides a partial thickness $t=t_A+t_B$, two equations (already indicated) govern the process, namely equation (1) and the equation, $$t=t_A+t_B. \quad (3)$$

Multiplying equation (3) by the quantity $(s-s_A)$, subtracting the resulting equation from equation (1), and then solving for $t_B$ yields, $$t_B = \frac{s - s_A}{s_B - s_A} t. \quad (4)$$

The value for $t_A$ is then given using equation (3), i.e.

$$t_A = t - t_B. \quad (5)$$

Figure 4:
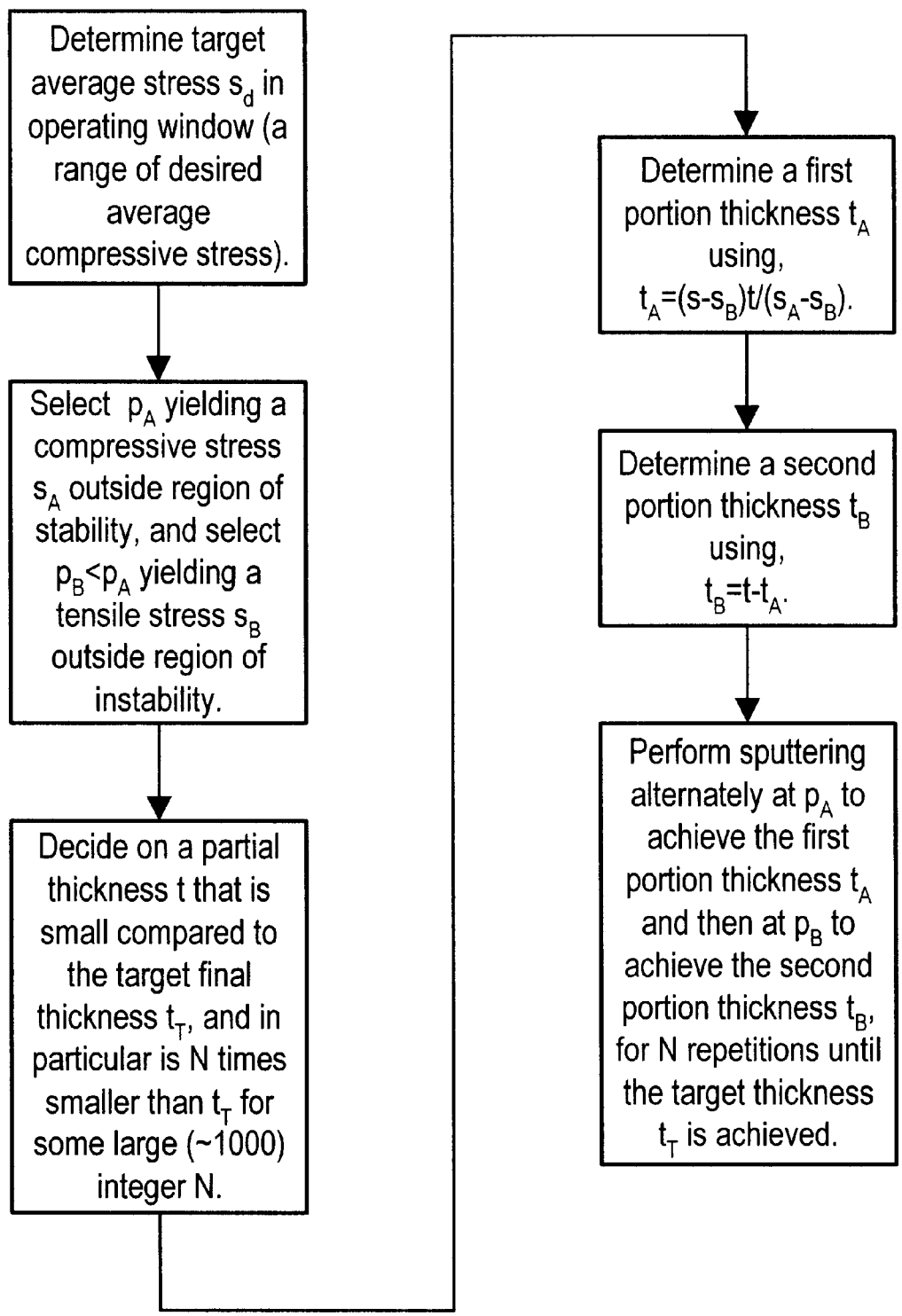
FIG. 4 is a flowchart illustrating one of various alternative methods for depositing a piezoelectric material as a thin film according to the invention.

FIG. 4 is a flowchart of the invention according to the more systematic method using equations (4) and (5).

Of course it is also possible to determine a total portion thickness $t_{T,A}$ and a total portion thickness $t_{T,B}$ (so that $t_T = t_{T,A} + t_{T,B}$) using either of the above strategies, to select the number of sputtering cycles N, and to then determine the (partial) portion thicknesses $t_A$ and $t_B$ using, $$t_A = t_{T,A}/N \text{ and } t_B = t_{T,B}/N.$$

Again referring to FIG. 2, in determining the boundaries of the region of instability, it is necessary to perform sufficient measurements to determine at what pressures, on either side of the desired intermediate strength compressive stress, the magnetron sputtering produces a thin film with stress values that differ by less than an acceptable amount, say no more than approximately 10%, although in the preferred embodiment, the boundaries should be chosen so as to correspond to less than 1% variation in the stress values.

Scope of the Invention

It is to be understood that the above-described arrangements are only illustrative of the application of the principles of the present invention. In particular, as nothing of what has said limits the invention to use only in the particular application of magnetron sputtering for laying down a thin film piezolayer as part of a BAW resonator, the present invention should be understood to comprehend a method of magnetron sputtering in case of depositing any thin film for use in any kind of device. Numerous modifications and alternative arrangements may be devised by those skilled in the art without departing from the spirit and scope of the present invention, and the appended claims are intended to cover such modifications and arrangements.

What is claimed is:

1. A method of fabricating a device comprising a thin film of material, the fabrication using magnetron sputtering to deposit the thin film, the method comprising the steps of:
    a) determining a first gas pressure at which the magnetron sputtering is stable and results in the material being deposited having a first stress;
    b) determining a second gas pressure at which the sputtering is stable and results in the material being deposited having a second stress, the second stress having a value that is less than a predetermined desired intermediate stress; and
    c) performing successive sputtering cycles, each cycle including sputtering at the first gas pressure so as to achieve a predetermined first thickness, and sputtering at the second gas pressure so as to obtain a predetermined second thickness;
        thereby depositing a thin film of the material having an average stress intermediate between the first stress and the second stress.

2. The method of claim 1, wherein the material being deposited is piezoelectric material.

3. The method of claim 1, wherein the device is a bulk acoustic wave resonator.

* * * * *

UNITED STATES PATENT AND TRADEMARK OFFICE
CERTIFICATE OF CORRECTION

PATENT NO.   : 6,521,100 B2
DATED        : February 18, 2003
INVENTOR(S)  : Jyrki Molarius et al.

It is certified that error appears in the above-identified patent and that said Letters Patent is hereby corrected as shown below:

<u>Title page, Item [54] and Column 1, line 1,</u>
"METHOD OF PRODUCING" should be -- METHOD FOR PRODUCING --

Signed and Sealed this

Twelfth Day of August, 2003

JAMES E. ROGAN
*Director of the United States Patent and Trademark Office*